United States Patent
Sugiyama et al.

(10) Patent No.: US 8,285,420 B2
(45) Date of Patent: Oct. 9, 2012

(54) CONTROL DEVICE, CONTROL METHOD, AND CONTROL PROGRAM

(75) Inventors: Kentaroh Sugiyama, Yamato (JP); Satoru Nakamura, Yamato (JP)

(73) Assignee: International Business Machines Corporation, Armonk, NY (US)

( * ) Notice: Subject to any disclaimer, the term of this patent is extended or adjusted under 35 U.S.C. 154(b) by 533 days.

(21) Appl. No.: 12/491,432

(22) Filed: Jun. 25, 2009

(65) Prior Publication Data

US 2009/0326721 A1   Dec. 31, 2009

(30) Foreign Application Priority Data

Jun. 30, 2008   (JP) ................................. 2008-170862

(51) Int. Cl.
*G05B 15/02* (2006.01)
*G05D 23/19* (2006.01)
(52) U.S. Cl. ............. 700/278; 62/180; 62/186; 361/691
(58) Field of Classification Search .......... 700/276–278, 700/304; 361/679.49, 691; 62/180, 186
See application file for complete search history.

(56) References Cited

U.S. PATENT DOCUMENTS

| | | | | |
|---|---|---|---|---|
| 7,568,360 B1 * | 8/2009 | Bash et al. | ...................... | 62/186 |
| 7,761,192 B2 * | 7/2010 | Lo | ................................. | 700/304 |
| 7,826,216 B2 * | 11/2010 | Moss | ....................... | 361/679.49 |
| 2006/0168975 A1 * | 8/2006 | Malone et al. | .................. | 62/180 |
| 2006/0234621 A1 * | 10/2006 | Desrochers et al. | .......... | 454/239 |
| 2009/0168345 A1 * | 7/2009 | Martini | .......................... | 361/691 |
| 2010/0163633 A1 * | 7/2010 | Barrett et al. | ................. | 236/49.3 |

FOREIGN PATENT DOCUMENTS

| | | | |
|---|---|---|---|
| JP | 9298377 A | | 11/1997 |
| JP | 2002032152 A | | 1/2002 |
| JP | 2006208000 A | | 8/2006 |

\* cited by examiner

*Primary Examiner* — John Cottingham
*Assistant Examiner* — Douglas Lee
(74) *Attorney, Agent, or Firm* — Hoffman Warnick LLC; Andrea Bauer (57) ABSTRACT

Provision of a control device, method and program capable of performing a suitable temperature control in a room having an equipment installed therein. A control device controls air-conditioning of a room having installed therein a plurality of pieces of equipment each being capable of drawing outside air to thereby cool down an interior of the equipment. A storage portion is capable of storing therein operating information that represents as to whether it is abnormal or not if each piece of equipment is put into a non-operating state. A temperature measurement portion is capable of measuring a temperature of the air drawn by each piece of equipment. A detection portion is capable of measuring a flow speed of the air drawn by each piece of equipment. A control portion is configured to control the air-conditioning based on the measurement result of the temperature or the flow speed of the air drawn by each piece of equipment.

18 Claims, 7 Drawing Sheets

CONTROL DEVICE, CONTROL METHOD, AND CONTROL PROGRAM

FIELD OF THE INVENTION

The present invention generally relates to a control device, a control method, and a control program. More particularly, the present invention relates to a control device, a control method, and a control program capable of controlling air-conditioning of a room having equipment installed therein.

BACKGROUND OF THE INVENTION

A server room of a data center has installed therein a number of server units, generating a large amount of heat. Therefore, it is necessary to efficiently control air-conditioning of the server room of the data center to control the temperature.

In the past, in a server room, an air-conditioning control wherein a temperature of a cool air supply (or blowing out) port of an air-conditioning unit is controlled to be constant, an air-conditioning control wherein a temperature of a warm air return port of the air-conditioning unit is controlled to be constant, or an air-conditioning control wherein a temperature of a wall surface of the server room is controlled to be constant has been performed, for example. Moreover, in some cases, a combination of such air-conditioning controls has been performed.

The server unit is configured to draw outside air through an intake port by means of a fan to thereby cool down an interior of the server room. Therefore, in some cases, an air-conditioning control wherein a temperature of air drawn into the interior of the server unit through the intake port is controlled to be constant has been performed.

As an operating method of a server system having a number of server units, there is known a method wherein some server units are put into a non-operating state during a period where a system load is low. By using such an operating method, it was possible to suppress the power consumption and resultant generated heat of the server system.

Figure 1:
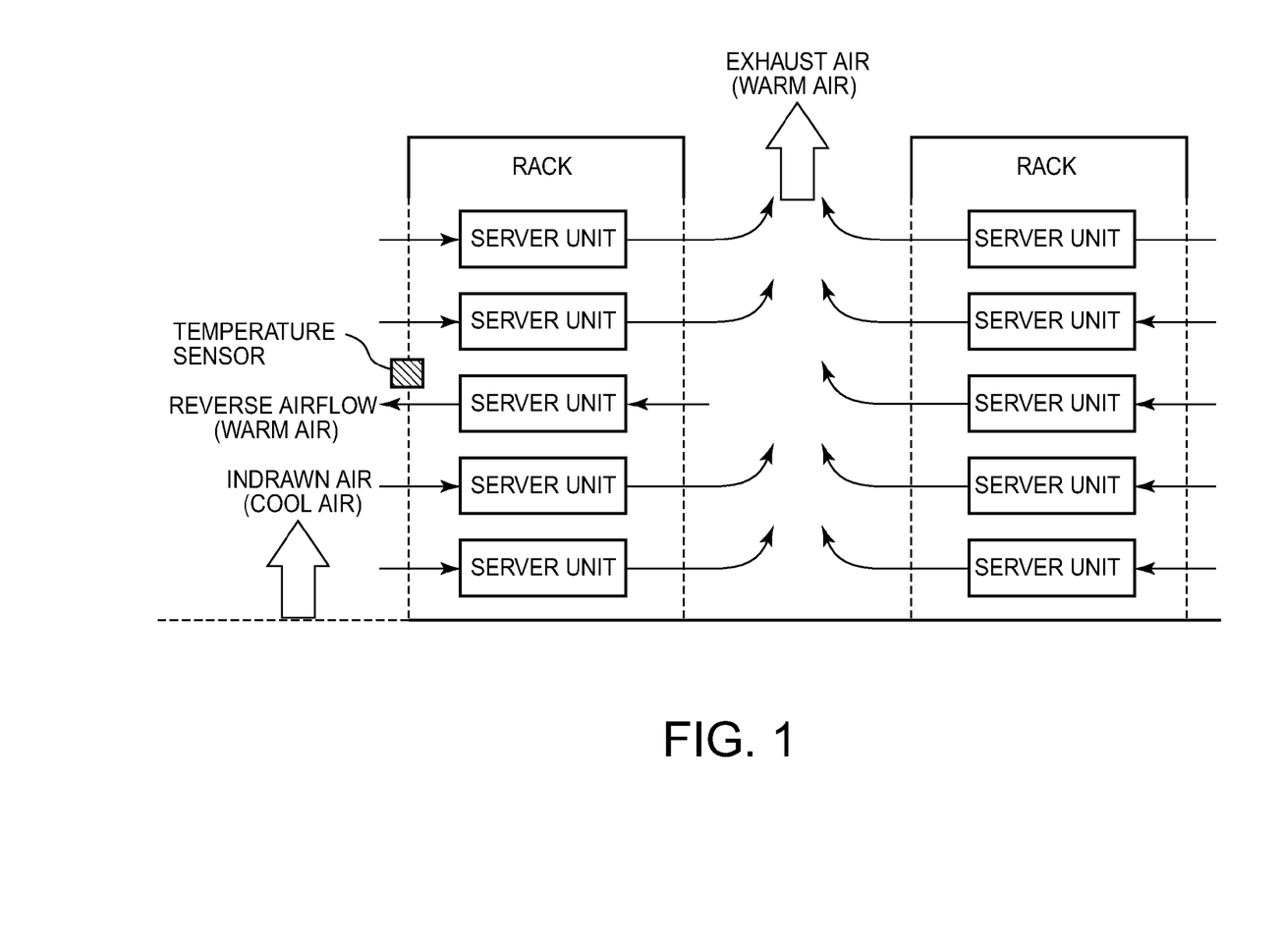
FIG. 1 is a diagram illustrating an example of a plurality of server units mounted in a rack with the flow of indrawn air and exhaust air around the rack.

FIG. 1 is a diagram illustrating an example of a plurality of server units mounted in a rack with the flow of indrawn air and exhaust air around the rack. When air-conditioning is used to control and maintain a constant temperature of the air drawn through the intake port of each of the server units, the following problems may occur if some server units are put into a non-operating state.

In the server unit in the non-operating state, the rotation of an internal fan thereof is stopped. Therefore, when a non-operating server unit is present among a plurality of operating server units, warm air exhausted from other server units may flow back to an intake port through an exhaust port of the non-operating server unit. As a result, the temperature detected by a temperature sensor mounted in the vicinity of the intake port of the non-operating server unit may exhibit (or indicate) a high value compared with the temperature of cool air supplied from an air-conditioning unit. Therefore, a control device for controlling the air-conditioning within the server room may perform control so that the temperature within the server room becomes lower than a present temperature. Accordingly, it is impossible to perform a suitable temperature control.

Japanese Patent Application Laid-Open No. 2006-208000 discloses a device provided with airflow sensors coupled to a plurality of fans in a server in a data center and a controller for controlling cooling of the data center in accordance with the detected airflow. In addition, Japanese Patent Application Laid-Open No. 2006-208000 describes that a three-dimensional airflow map is generated based on the detected airflow and the fan location. However, according to the invention disclosed in Japanese Patent Application Laid-Open No. 2006-208000, it may be difficult to perform a suitable temperature control when a non-operating server unit is present.

Japanese Patent Application Laid-Open No. 9-298377 discloses a device provided with a temperature sensor for measuring a temperature of air discharged through a ventilation port of a heat exchanger and a flow speed sensor for measuring a flow speed of air discharged through the ventilation port of the heat exchanger. According to the invention disclosed in Japanese Patent Application Laid-Open No. 9-298377, although it is possible to detect a failure of the heat exchanger, it may be difficult to perform a suitable temperature control when a non-operating server unit is present.

Japanese Patent Application Laid-Open No. 2002-032152 discloses a method for automatically interrupting the supply or the cutoff of electric power to an information system based on a comparison between a flow speed measurement of cooling air flowing into the information system and a reference value. According to the invention disclosed in Japanese Patent Application Laid-Open No. 2002-032152, although it is able to detect an abnormality in the flow speed due to a failure or the like of an internal fan and to perform a shutdown process, it may be difficult to perform a suitable temperature control when a non-operating server unit is present.

SUMMARY OF THE INVENTION

The present invention provides a control device, a control method, and a control program, capable of solving or obviating these and other deficiencies of the prior art.

In accordance with an aspect of the present invention, there is provided a control device for controlling air-conditioning of a room containing equipment capable of drawing outside air to cool down an interior of the equipment, comprising: a temperature measurement portion for measuring a temperature of air drawn by the equipment; a detection portion for detecting whether the equipment is drawing or exhausting air; and a control portion for controlling the air-conditioning based on the measured temperature and whether the equipment is drawing or exhausting air.

In accordance with another aspect of the present invention, there is provided a control device for controlling air-conditioning of a room containing equipment, the equipment being capable of drawing outside air to cool down an interior of the equipment, comprising: a storage portion for storing operating information representing whether it is abnormal if the equipment is placed in a non-operating state, or if it is not abnormal even when the equipment is placed in the non-operating state; a temperature measurement portion for measuring a temperature of air drawn by the equipment; a detection portion for measuring a flow speed of air drawn by the equipment; a holding portion for holding the temperature measurement portion and the detection portion; a driving portion for moving the holding portion toward an intake port side of the equipment; and a control portion for controlling the driving portion to measure the temperature or the flow speed of air drawn by the equipment to control the air-conditioning based on a measurement result, the control portion being configured to: determine that the equipment is drawing air by comparing the measured flow speed to a reference value; control the air-conditioning to decrease the temperature of air drawn by the equipment when the measured temperature is higher than a reference temperature, and the equipment is drawing air at a flow speed of at least the reference value; output a warning to a user when the operating information indicates that it is abnormal if the equipment is placed into a non-operating state, and the equipment is not drawing air at a flow speed of at least the reference value; and maintain a control state of the air-conditioning when the operating information indicates that it is not abnormal if the equipment is placed into a non-operating state and is not drawing air.

In accordance with another aspect of the present invention, there is provided a control method for controlling air-conditioning of a room containing equipment capable of drawing outside air to cool down an interior of the equipment, comprising: measuring a temperature of air drawn by the equipment; detecting whether the equipment is drawing or exhausting air; and controlling the air-conditioning based on the measured temperature and whether the equipment is drawing or exhausting air.

In accordance with another aspect of the present invention, there is provided a computer program stored on a computer readable medium, which when executed by a computer, controls air-conditioning of a room containing equipment capable of drawing outside air to cool down an interior of the equipment, comprising program code for: measuring a temperature of air drawn by the equipment; detecting whether the equipment is drawing or exhausting air; and controlling the air-conditioning based on the measured temperature and whether the equipment is drawing or exhausting air.

In the summary of the present invention, not all the necessary features of the invention are listed. Sub-combinations and other combinations of the features can constitute the present invention.

DETAILED DESCRIPTION OF THE INVENTION

The present invention will be described with respect to an embodiment thereof. The embodiment described below, however, is not limiting of the invention set forth in the appended claims, and all combinations of features described in the description of the embodiment are not necessarily indispensable to the solution according to the present invention.

Figure 2:
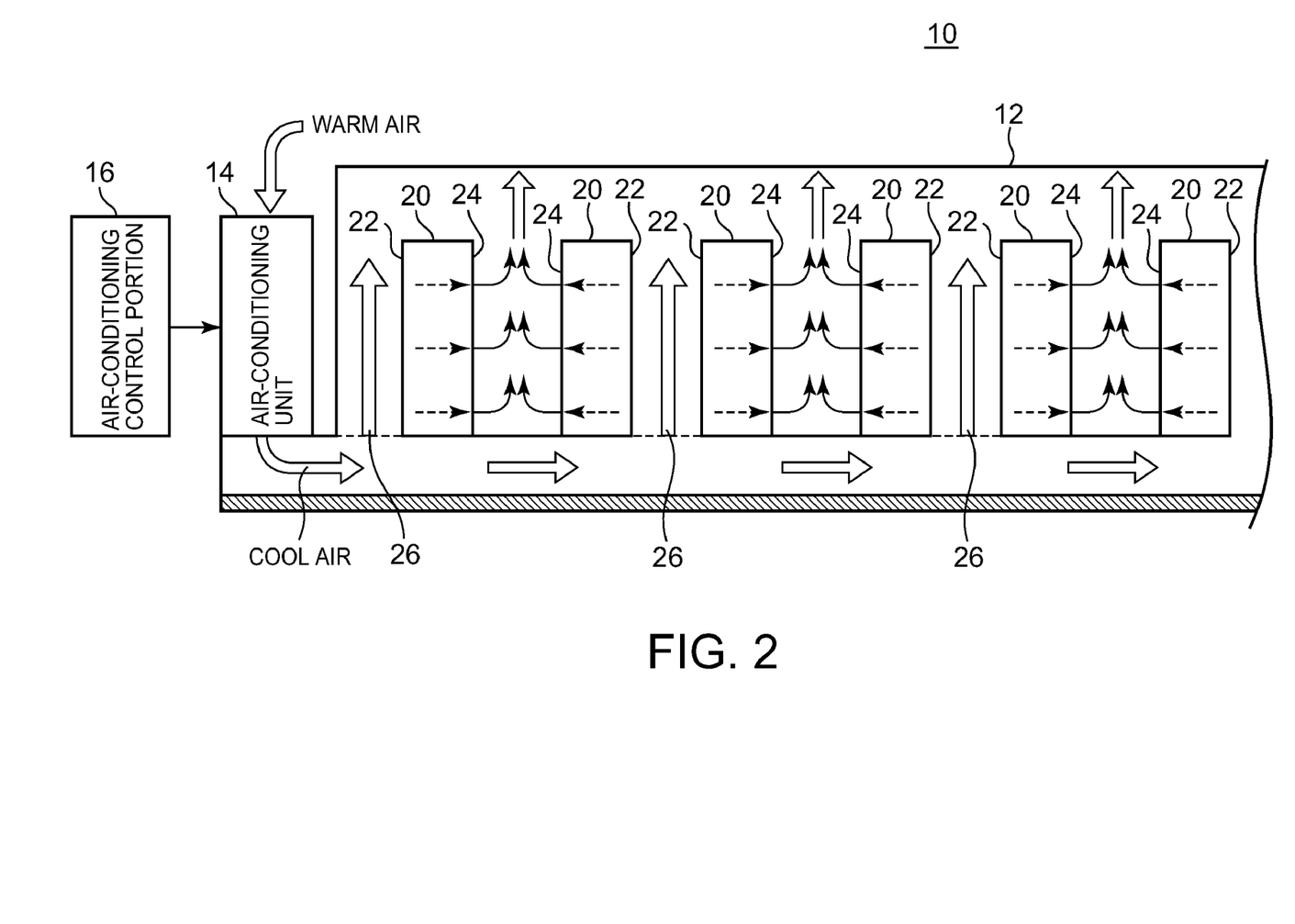
FIG. 2 is a diagram illustrating an exemplary construction of a data center according to an embodiment of the present invention.
Figure 3:
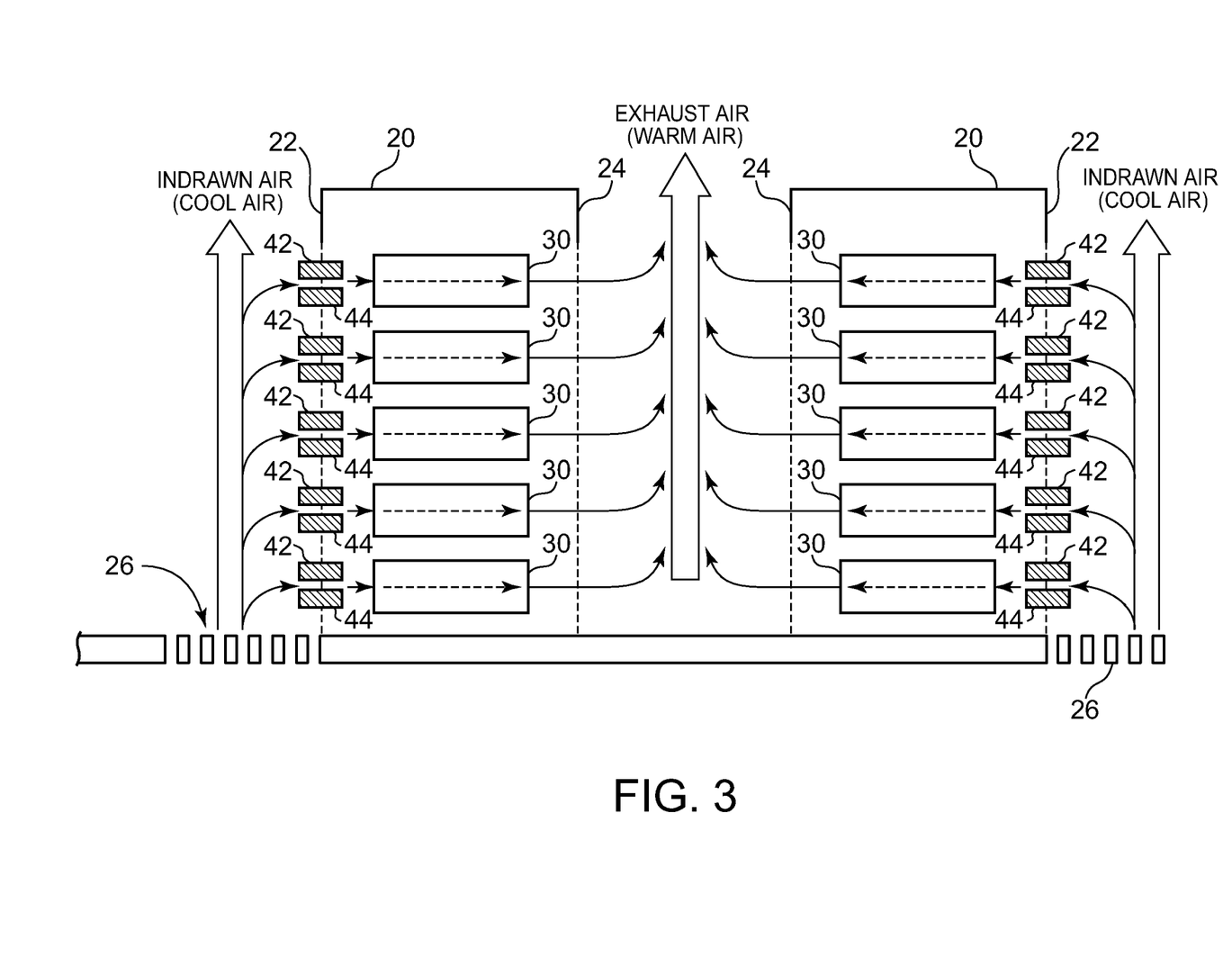
FIG. 3 is a diagram illustrating an example of a plurality of server units mounted in a rack with the flow of air around the rack.

FIG. 2 is a diagram illustrating an exemplary construction of a data center 10 according to an embodiment of the present invention. FIG. 3 is a diagram illustrating an example of a plurality of pieces of equipment, in this case server units 30, mounted in a rack 20 and the flow of air around the rack 20.

The data center 10 is provided with a server room 12, an air-conditioning unit 14, and an air-conditioning control portion 16. In the server room 12, at least one rack 20 is provided. The air-conditioning unit 14 adjusts the air-conditioning of the interior of the server room 12. That is, the air-conditioning unit 14 supplies cool air to the interior of the server room 12 and receives warm air from the interior of the server room 12, so that a temperature of the interior of the server room 12 is adjusted to become equal to a predetermined temperature setting value.

The air-conditioning control portion 16 is configured to control an operation of the air-conditioning unit 14 to control the air-conditioning of the interior of the server room 12. By way of an example, the air-conditioning control portion 16 may be configured as a computer that executes a program.

The rack 20 is configured to mount therein at least one server unit 30. Each of the server units 30 is connected to a network and is capable of performing data computation processing and data storage.

Each server unit 30 includes a mechanism for drawing in outside air to cool down an interior of the server unit 30 during an operating state. In an embodiment, each server unit 30 is provided with an internal fan, which is configured to rotate so that the outside air is drawn through an intake port to cool down the interior while exhausting warm air through an exhaust port. Moreover, in an embodiment, each server unit 30 is configured to stop the rotation of the internal fan during a non-operating state.

In the present embodiment, at least one of the server units 30 mounted in each rack 20 is arranged such that outside air is drawn from mutually identical directions while inside air is exhausted from mutually identical directions. More specifically, at least one of the server units 30 is arranged such that an intake port is oriented toward a first side surface (hereinafter, referred to as "intake-side side surface 22") of the rack 20, and an exhaust port is oriented toward a second side surface (hereinafter, referred to as "exhaust-side side surface 24") opposite the intake-side side surface 22 of the rack 20. Moreover, a plurality of racks 20 of the server room 12 are arranged within the server room 12 so that the intake-side side surfaces 22 of neighboring racks 20 face each other, and the exhaust-side side surfaces 24 of the neighboring racks 20 face each other.

Furthermore, in an present embodiment, the air-conditioning unit 14 is configured to supply cool air to the interior of the server room 12 through a floor side of the server room 12 and receive warm air from the interior of the server room 12 through a ceiling side of the server room 12. The air-conditioning unit 14 may be configured to supply cool air, through ventilation ports 26 provided to a floor thereof, to a space surrounded by the intake-side side surfaces 22 of two neighboring racks 20. By way of an example, the air-conditioning unit 14 may be one which is capable of adjusting a temperature or the like of cool air for each of the ventilation ports 26.

In addition, the data center 10 is provided with at least one temperature measurement portion 42 and at least one detection portion 44. The respective temperature measurement portions 42 and detection portions 44 are provided so as to correspond to at least one of the server units 30 provided in the server room 12.

Figure 4:
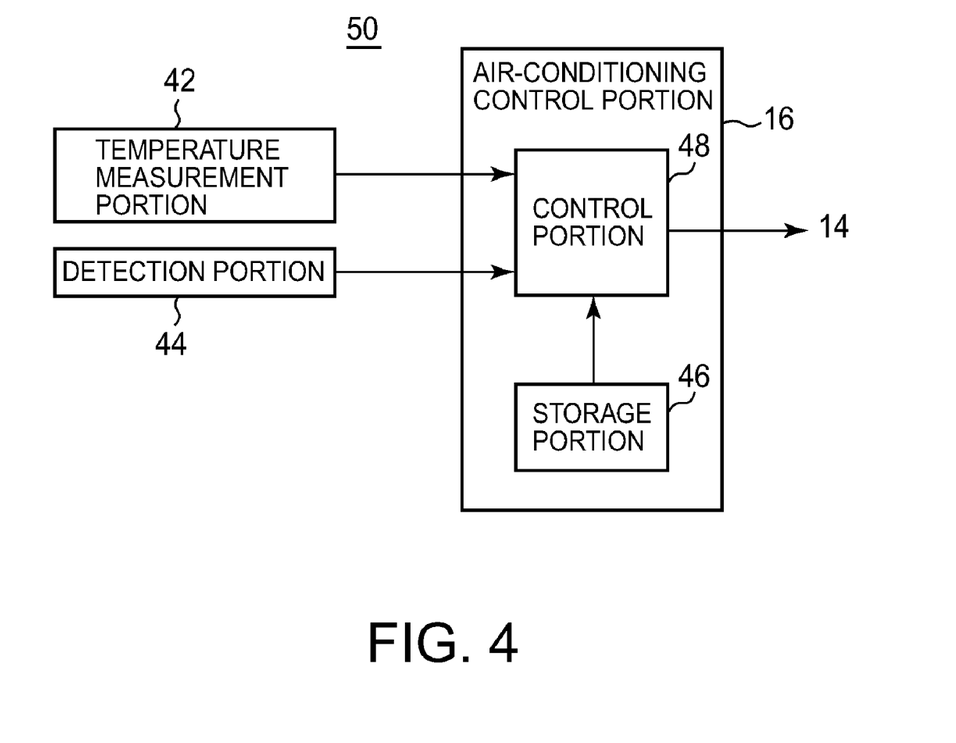
FIG. 4 is a block diagram illustrating an exemplary functional construction of a control device according to an embodiment of the present invention.

FIG. 4 is a block diagram illustrating an exemplary functional construction of a control device 50 according to an embodiment of the present invention. In the data center 10 illustrated in FIGS. 2 and 3, in the air-conditioning control portion 16, at least one of the temperature measurement portion 42 and at least one of the detection portion 44 cooperate with each other to function as the control device 50 that controls air-conditioning of the server room 12 in which the server units 30 are installed. That is, the control device 50 is provided with at least one temperature measurement portion 42, at least one detection portion 44, and the air-conditioning control portion 16, and is configured to control the air-conditioning unit 14 so that the interior of the server room 12 can be maintained at a suitable temperature, humidity, and the like. Moreover, the control device 50 according to the present embodiment may be configured to control the air-conditioning of a room having installed therein other equipment capable of drawing outside air to thereby cool down an interior thereof, without being limited to the server room 12 in which the server unit 30 is installed.

Each of the temperature measurement portions 42 is provided at an intake port side of a corresponding server unit 30 so as to measure a temperature of the air drawn into the server unit 30. Each of the temperature measurement portions 42 may be provided at a position of the intake-side side surface 22 of the rack 20 disposed close to the intake port of the corresponding server unit 30. Each of the temperature measurement portions 42 may be configured to send or deliver a measurement result to the air-conditioning control portion 16 via a wired or wireless transmission system.

Each of the detection portions 44 is capable of detecting whether each of the server units 30 is drawing or exhausting air. Owing to this configuration, each of the detection portions 44 is capable of detecting whether each of the server units 30 is in an operating state or a non-operating state. Each of the detection portions 44 may be configured to deliver a detection result to the air-conditioning control portion 16 via a wired or wireless transmission system.

Each of the detection portions 44 may be provided at an intake port side of a measurement target server unit 30. That is, each of the detection portions 44 may be provided at a position of the intake-side side surface 22 of the rack 20 disposed in the vicinity of (close to) the intake port of the measurement target server unit 30. Moreover, each of the detection portions 44 may be configured as an anemometer for measuring a flow speed of the drawn air.

Alternatively, each of the detection portions 44 may be provided at an exhaust port side of the measurement target server unit 30. That is, each of the detection portions 44 may be provided at a position of the exhaust-side side surface 24 of the rack 20 disposed in the vicinity of the exhaust port of the measurement target server unit 30. Moreover, each of the detection portions 44 may be configured as an anemometer for measuring a flow speed of the exhausted air.

The air-conditioning control portion 16 is provided with a storage portion 46 and a control portion 48. The storage portion 46 is configured to store therein operating information that represents whether it is abnormal or not if each of the server units 30 installed in the server room 12 is put into a non-operating state. Here, by way of an example, equipment that always operates can be said to be abnormal if it is put into a non-operating state. As another example, equipment that continuously operates without stopping during a specified period can be said to be abnormal if it is put into a non-operating state (e.g., during the specified period).

The control portion 48 is configured to control the air-conditioning unit 14 based on a measurement result and a detection result of each temperature measurement portion 42 and each detection portion 44, respectively. Here, the control portion 48 control the air-conditioning based on the temperature measured by the temperature measurement portion 42, on condition that the detection portion 44 has detected that the server unit 30 is drawing or exhausting air. By way of an example, the control portion 48 may be configured to determine that the server unit 30 is drawing or exhausting air when the flow speed is equal to or higher than a reference value.

Moreover, the control portion 48 may be configured to output a warning to a user when operating information, indicating that it is abnormal if the measurement target server unit 30 is put into a non-operating state, is stored in the storage portion 46 (e.g., on condition that the server unit 30 is neither drawing nor exhausting the air). For example, the control portion 48 displays warning information on a display portion provided on the control portion 48 or outputs a buzzer sound or an audible warning signal through a speaker.

Figure 5:
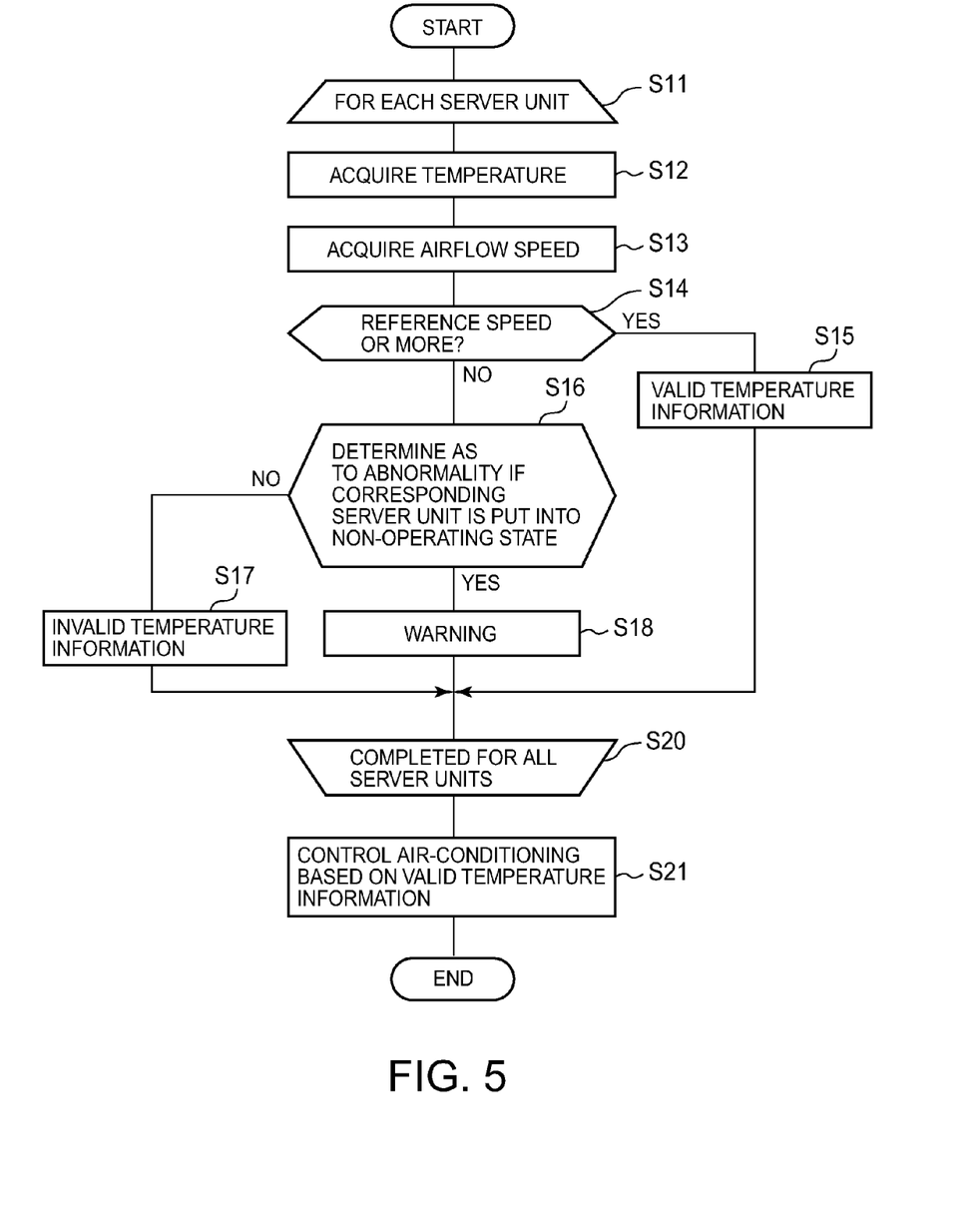
FIG. 5 is a flow chart illustrating an exemplary operation of a control device according to an embodiment of the present invention.

FIG. 5 is a flow chart illustrating an exemplary operation of the control device 50 according to an embodiment of the present invention. The flow illustrated in FIG. 5 illustrates an example where the detection portion 44 is configured as an anemometer provided at the intake port of a corresponding server unit 30.

The control device 50 executes the following processes of steps S11 to S21 during an operating state of any one of the server units 30 installed in the server room 12. The control device 50 repeats the processes of steps S12 to S18 for each of the plurality of server units 30 (S11, S20).

First, the temperature measurement portion 42 measures a temperature of the air drawn by the measurement target server unit 30 (S12). Subsequently, the detection portion 44 measures a flow speed of the air drawn by the measurement target server unit 30 (S13).

The control portion 48 then compares the flow speed measured by the detection portion 44 in step S13 is to a reference value (S14). When the flow speed measured by the detection portion 44 is determined to be the reference value or greater (S14: Yes), the control portion 48 determines that the measurement target server unit 30 is in an operating state and that the temperature measured by the temperature measurement portion 42 in step S12 for the server unit 30 is valid (S15).

When the flow speed measured by the detection portion 44 is determined to be smaller than the reference value (S14: No), the control portion 48 proceeds to step S16. In this case, the control portion 48 may be configured to determine that the flow speed measured by the detection portion 44 is smaller than the reference value, even when an airflow flowing in a reverse direction to the airflow of the air drawn by the measurement target server unit 30 is detected.

In step S16, the control portion 48 reads out the operating information stored in the storage portion 46 to determine whether or not the measurement target server unit 30 is a type of equipment which can be said to be operating abnormally if it is put into a non-operating state (S16). When the measurement target server unit 30 is determined not to be a type of equipment which can be said to be operating abnormally if it is put into a non-operating state (S16: No), the control portion 48 determines that the measurement target server unit 30 is in a non-operating state. In this case, the temperature measured by the temperature measurement portion 42 in step S12 for the server unit 30 is not valid (S17).

When the measurement target server unit 30 is determined to be a type of equipment which can be said to be operating abnormally if it is put into a non-operating state (S16: Yes), the control portion 48 displays warning information on a display portion provided to the control portion 48 or outputs a buzzer sound or an audible warning signal through a speaker, for example (S18). Owing to this configuration, the control portion 48 is able to send a notification to the user to inform the user that the server unit 30 is in a non-operating state.

Upon completion of either one of the processes of step S15, S17, or S18, the control portion 48 determines whether or not the process has been completed for all of the plurality of temperature measurement portions 42 (S20). Upon completion of the processes of steps S12 to S18, for all the temperature measurement portions 42, the control portion 48 proceeds to step S21.

In step S21, the control portion 48 controls the air-conditioning of the server room 12 based on the temperature information considered as valid. By way of an example, the control portion 48 controls the air-conditioning for a server unit 30 which exhibits a flow speed exceeding the reference value and for which temperature information considered as valid has been detected. Moreover, the control portion 48 may be configured to maintain a present control state of the air-conditioning for a server unit 30 which has been determined is normal if put into a non-operating state, and for which the temperature information considered as invalid has been detected. Furthermore, when it is difficult to individually control the air-conditioning for each server unit 30, the control portion 48 may control the air-conditioning for the whole server room 12 or for each of the ventilation ports 26 on the floor. In addition, when it is difficult to individually control the air-conditioning for each server unit 30, and when a high priority is given to a stable operation of the server units 30, the control portion 48 may decrease the overall temperature of the server room 12 even when a high temperature has been detected in one of the server units 30.

For example, in step S21, the control portion 48 may be configured to control the air-conditioning to thereby decrease the temperature of the air drawn by the measurement target server unit 30 when the measured temperature is higher than a reference temperature, on condition that the measurement target server unit 30 is drawing air. Moreover, the control portion 48 may be configured to maintain a control state of the air-conditioning when the operating information indicating that it is not abnormal if the measurement target server unit 30 is put into a non-operating state is stored in the storage portion 46 (S16: No), on condition that the server unit 30 is not drawing air.

Furthermore, the control portion 48 may be configured to control the air-conditioning to decrease the temperature of the air drawn by the server unit 30 when the measured temperature is higher than a first reference temperature, on condition that the server unit 30 is drawing air, for example. In this case, the control portion 48 may control the air-conditioning to decrease the temperature of the air drawn by the server unit 30 when the measured temperature is higher than a second reference temperature higher than the first reference temperature, regardless of whether or not the server unit 30 is drawing air. Owing to this configuration, when the detected temperature is too high, the control portion 48 is able to cool down the server unit 30, regardless of the flow speed measured by the detection portion 44.

In addition, the control portion 48 may be configured to control the air-conditioning to decrease the temperature of the air drawn by the server unit 30 when the operating information indicating that it is abnormal if the measurement target server unit 30 is put into a non-operating state is stored in the storage portion 46, on condition that the server unit 30 is neither drawing nor exhausting the air. That is, when the fan of the server unit 30, which can be said that it is abnormal if it is put into a non-operating state, is stopped, the control portion 48 may decrease the temperature of the server room 12 from a target temperature so that an operating state of the server unit 30 can be maintained.

The control device 50 having the configuration described above controls the air-conditioning of the server room 12 based on the temperature information measured by the temperature measurement portion 42 provided so as to correspond to the server unit 30 in its operating state. That is, when the measurement target server unit 30 is in a non-operating state, the control device 50 controls the air-conditioning of the server room 12 regardless of the temperature information obtained from the temperature measurement portion 42 having received the exhaust air or the like from other server units 30. Owing to this configuration, the control device 50 is able to control the air-conditioning of the server room 12 in an efficient manner.

Figure 6:
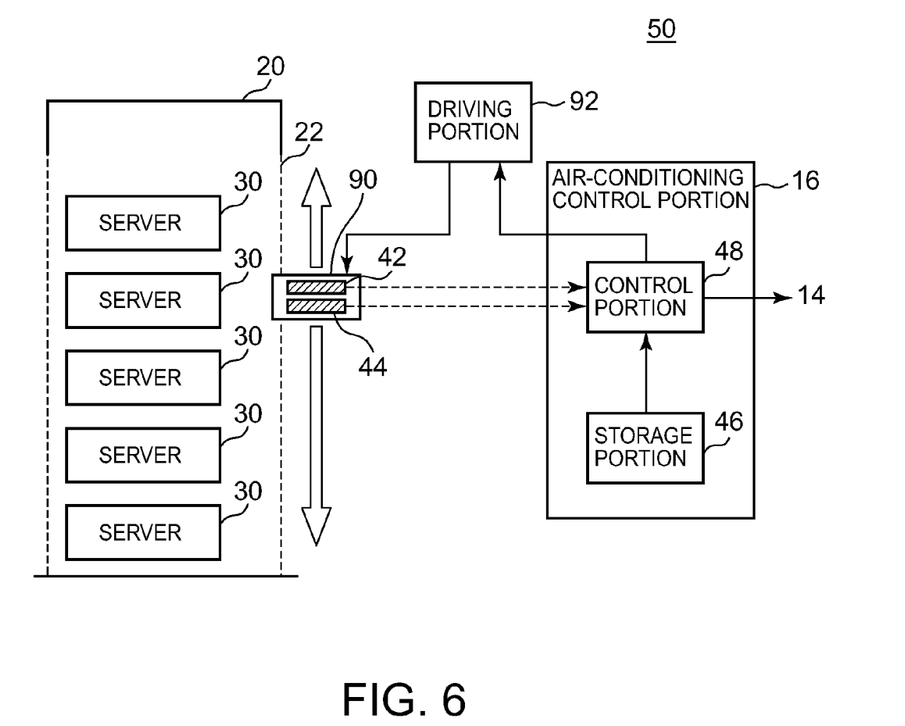
FIG. 6 is a block diagram illustrating a control device according to a modified example of an embodiment of the present invention, shown along with a plurality of server units.

FIG. 6 is a block diagram illustrating a control device 50 according to a modified example of the embodiment of the present invention, shown along with a plurality of server units 30. The control device 50 according to the modified example has substantially the same configuration and function as the control device 50 according to the present embodiment, described with reference to FIGS. 2 to 5. Therefore, components having substantially the same configuration and function as those of the control device 50 according to the present embodiment, described with reference to FIGS. 2 to 5 will be denoted by the same reference numerals. A redundant description thereof will not be provided in the following description.

The control device 50 according to the modified example further includes a holding portion 90 and a driving portion 92. The holding portion 90 is configured to hold therein at least one of the temperature measurement portion 42 and the detection portion 44. The driving portion 92 is configured to move the holding portion 90 toward an intake port side of the measurement target server unit 30 of a plurality of server units 30. The driving portion 92 may be provided to the intake-side side surface 22 of the rack 20 so as to move the holding portion 90 along the server units 30 within the rack 20.

The control portion 48 may be configured to control the driving portion 92 to move the holding portion 90 based on at least one of the measurement results of the temperature measurement portion 42 and the detection results of the detection portion 44. By way of an example, when the temperature of the air drawn by the server unit 30 is higher than a predetermined value, the control portion 48 may further measure the temperature of the air drawn by the server unit 30 and/or increase the period of time, in which the holding portion 90 is stopped at the server unit 30, to be longer than that of other server units 30, so that a more accurate temperature can be measured. By way of another example, the control portion 48 may perform a similar control when the flow speed of the air drawn by the server unit 30 is lower than a predetermined value. Furthermore, when the holding portion 90 is moved to a server unit 30, which can be said that it is abnormal if it is put into a non-operating state, the control portion 48 may increase the time for measuring the temperature of the air drawn by the server unit 30 to be larger than that of other server units 30, and/or increase the period of time in which the holding portion 90 is stopped at the server unit 30 to be longer than that of other server units 30.

Moreover, the control portion 48 is configured to control the driving portion 92 to measure the temperature or the flow speed of the air drawn by each of a plurality of server units 30 to thereby control the air-conditioning based on the measurement results. According to the control device 50 having such a configuration, the temperature of the air drawn by each of a plurality of server units 30 can be accurately measured by a small number of temperature measurement portions 42 and detection portions 44. Moreover, it is possible to accurately detect whether or not each of a plurality of server units 30 is drawing air.

Figure 7:
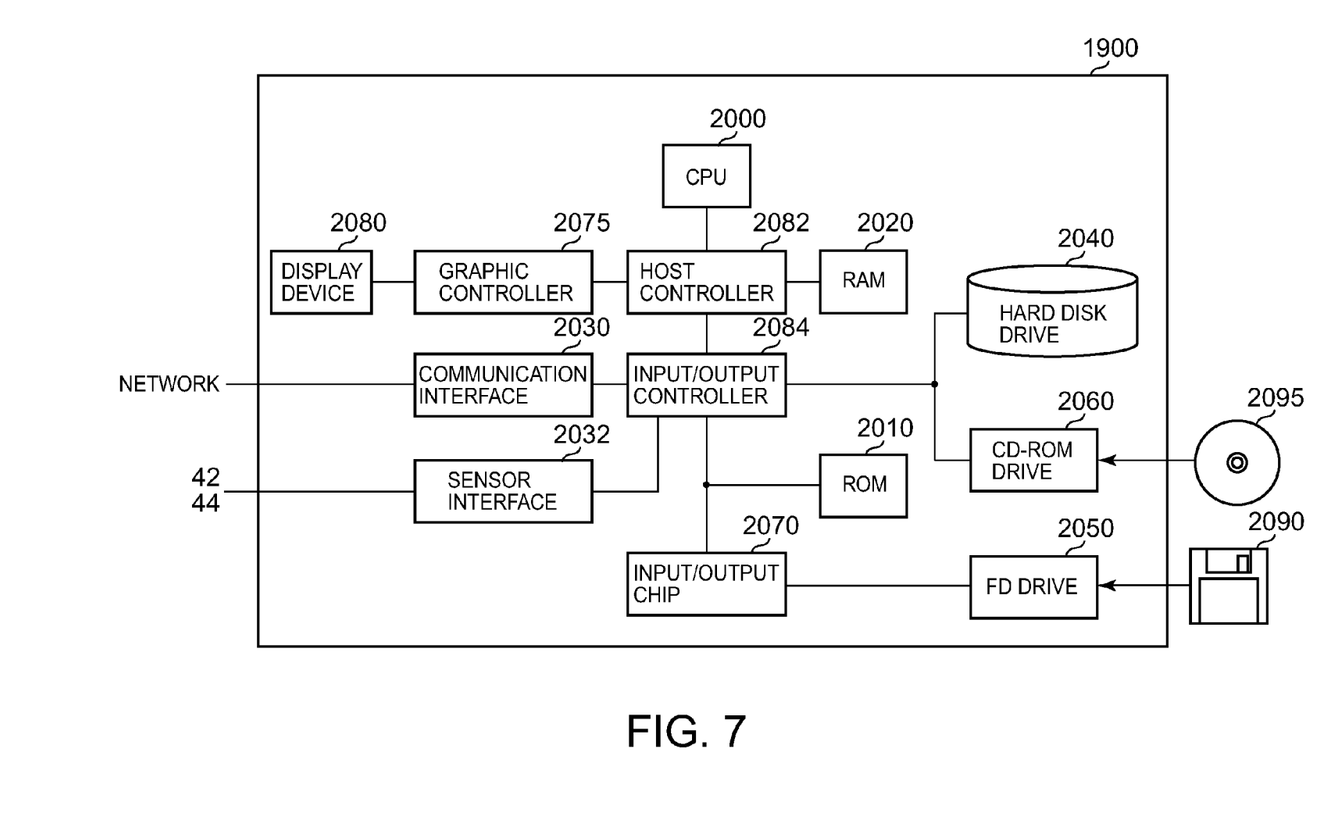
FIG. 7 is a diagram illustrating an exemplary hardware construction of a computer according to an embodiment of the present invention.

FIG. 7 is a diagram illustrating an exemplary hardware construction of a computer 1900 according to the embodiment of the present invention. The computer 1900 according to the present embodiment is provided with a CPU peripheral section having a CPU 2000, a RAM 2020, a graphic controller 2075, and a display device 2080 connected to each other by a host controller 2082. The computer 1900 further includes an input/output section having a communication interface 2030, a hard disk drive 2040, and a CD-ROM drive 2060 connected to the host controller 2082 by an input/output controller 2084, and a legacy input/output section having a ROM 2010, a flexible disk drive 2050, and an input/output chip 2070 connected to the input/output controller 2084.

The host controller 2082 connects the RAM 2020, and the CPU 2000 and the graphic controller 2075, which access the RAM 2020 at a high transfer rate. The CPU 2000 operates in accordance with program stored in the ROM 2010 and the RAM 2020, and controls each component. The graphic controller 2075 acquires image data generated, by the CPU 2000 and the like, on a frame buffer provided in the RAM 2020, and displays the image data on the display device 2080. Alternatively, the graphic controller 2075 may contain therein a frame buffer for storing the image data generated by the CPU 2000 or the like.

The input/output controller 2084 connects the host controller 2082, the communication interface 2030, which is an input/output device of a comparatively high speed, the hard disk drive 2040, and the CD-ROM drive 2060. The communication interface 2030 performs communication with other units via a network.

The sensor interface 2032 is configured to communicate with the temperature measurement portion 42 and the detection portion 44 according to the present embodiment. More specifically, the sensor interface 2032 acquires, through communication, the measurement result of the temperature of the air drawn by the measurement target server unit 30 from the temperature measurement portion 42. Moreover, the sensor interface 2032 acquires the determination result as to whether the measurement target server unit 30 is drawing or exhausting the air, from the detection portion 44. The sensor interface 2032 may be configured to acquire the flow speed of the air drawn by the measurement target server unit 30 or the flow speed of the air exhausted by the measurement target server unit 30.

The hard disk drive 2040 stores program and data used by the CPU 2000 within the computer 1900. The CD-ROM drive 2060 reads program or data from a CD-ROM 2095 and provides the read program or data to the hard disk drive 2040 via the RAM 2020.

Moreover, the input/output controller 2084 is connected to the ROM 2010 and input/output devices of a comparatively low speed, i.e., the flexible disk drive 2050 and the input/output chip 2070 or the like. The ROM 2010 stores a boot program executed by the computer 1900 at the startup time, and/or programs or the like dependent on the hardware of the computer 1900. The flexible disk drive 2050 reads a program or data from a flexible disk 2090 and provides the read program or data to the hard disk drive 2040 via the RAM 2020. The input/output chip 2070 connects the flexible disk drive 2050 to the I/O controller 2084 while connecting various input/output devices, for example, through a parallel port, a serial port, a keyboard port, a mouse port, and the like, to the I/O controller 2084.

A program provided to the hard disk drive 2040 via the RAM 2020 is provided by a user in a state of being stored on a recording medium (e.g., a computer readable medium), such as the flexible disk 2090, the CD-ROM 2095, or an IC card. The program is read out from the recording medium, installed in the hard disk drive 2040 within the computer 1900 via the RAM 2020, and executed in the CPU 2000.

A program installed in the computer 1900 and causing the computer 1900 to function as the air-conditioning control portion 16 includes a control module and a storage module. The program or modules are controlled by the CPU 2000 or the like and cause the CPU 2000 of the computer 1900 to function as the control portion 48 while causing the RAM 2020, the hard disk drive 2040, or the like of the computer 1900 to function as the storage portion 46.

Information processing routines described in the program are read into the computer 1900, so that the computer 1900 functions as the storage portion 46 and the control portion 48, which are specific means incorporating therein software and hardware resources described above. Moreover, when computation or processing of information in accordance with the purpose of use of the computer 1900 according to the present embodiment are realized by the specific means, a special-purpose control device 50 corresponding to the purpose of use can be constructed.

By way of an example, when communication between the computer 1900 and external devices or the like is carried out, the CPU 2000 executes a communication program loaded on the RAM 2020 and instructs the communication interface 2030 to perform communication processing based on processing procedures described in the communication program. Upon receipt of a control of the CPU 2000, the communication interface 2030 reads transmission data stored in a transmission buffer area or the like provided on a storage device such as the RAM 2020, the hard disk drive 2040, the flexible disk 2090, or the CD-ROM 2095 to transmit the read transmission data via a network, or writes reception data received via a network on a reception buffer area or the like provided on a storage device. In this manner, the communication interface 2030 may be configured to transmit/receive data to/from a storage device by a DMA (direct memory access) method. Alternatively, data may be transmitted/received in such a manner that the CPU 2000 read data from a storage device or the communication interface 2030 as a transmission source so that the data can be written to the communication interface 2030 or a storage device as a transmission destination.

Moreover, the CPU 2000 reads, by DMA transmission or the like, the entire or necessary portion of the files or databases stored in an external storage device, such as the hard disk drive 2040, the CD-ROM drive 2060 (CD-ROM 2095), or the flexible disk drive 2050 (flexible disk 2090), into the RAM 2020, and performs a variety of processing onto the data on the RAM 2020. Furthermore, the CPU 2000 returns the processed data to the external storage device by DMA transmission or the like. In such processing, since the RAM 2020 may be considered as one which temporarily stores therein the contents of the external storage device, in the present embodiment, the RAM 2020, the external storage device and the like will be referred to as a memory, a storage portion, a storage device or the like. In the present embodiment, a variety of program and a variety of information such as data, table, or database are stored on such a storage device and subjected to information processing. In addition, the CPU 2000 may store a portion of the contents of the RAM 2020 on a cache storage device so that reading/writing can be performed on the cache storage device. In such an implementation aspect, since the cache storage device is capable of performing a portion of the functions of the RAM 2020, in the present embodiment, the cache storage device will be intended to be included in the scope of the RAM 2020, the memory, and/or the storage device, unless they are described in a distinguished manner.

Furthermore, the CPU 2000 performs a variety of processing including a variety of computation, information processing, conditional determination, information retrieval and replacement, described in the present embodiment, as specified by a program command sequence, on the data read from the RAM 2020, and returns the processed data to the RAM 2020. For example, when conditional determination is made, the CPU 2000 compares a variety of variables used in the present embodiment with another variable or an integer to determine whether or not they satisfy a condition such as larger, smaller, not smaller, not larger, or equal, and proceeds to another command sequence when the condition is satisfied (or not satisfied) or invokes a subroutine.

In addition, the CPU 2000 is capable of retrieving information stored in files or databases within a storage device. For example, when a plurality of entries, in which an attribute value of a first attribute is correlated with an attribute value of a second attribute, is stored in a storage device, the CPU 2000 can obtain the attribute value of the second attribute correlated with the attribute value of the first attribute satisfying a predetermined condition by retrieving an entry, of which the attribute value of the first attribute matches with a designated condition, from the plurality of entries stored in the storage device and reading the attribute value of the second attribute stored for the retrieved entry.

The program or modules mentioned above may be stored on an external storage medium. As the recording medium, an optical recording medium such as a DVD or a CD, a magneto-optic recording medium such as an MO, a tape medium, a semiconductor memory such as an IC card, or the like can be used as well the flexible disk 2090 and the CD-ROM 2095. Also, a storage device such as a hard disk or a RAM provided in a server system connected to a special-purpose communication network or the Internet may be used as the recording medium to provide the program to the computer 1900 via a network.

While the present invention has been described with respect to the embodiment thereof, it is not limited to the scope described above with respect to the embodiment. It is, therefore, to be understood that various changes and medications of the above-described embodiment will readily occur to those skilled in the art. It is apparent from the description in the appended claims that other embodiments of the invention provided by making such changes and modifications are also included in the technical scope of the present invention.

The invention claimed is:

1. A control device for controlling air-conditioning of a room containing equipment capable of drawing outside air to cool down an interior of the equipment, comprising:
   a temperature measurement portion for measuring a temperature of air drawn by the equipment;
   a detection portion for detecting whether the equipment is drawing or exhausting air;
   a control portion for controlling the air-conditioning based on the measured temperature and whether the equipment is drawing or exhausting air; and
   a storage portion for storing operating information indicating that it is abnormal if the equipment is placed in a non-operating state or that it is not abnormal even when the equipment is placed in the non-operating state;
   wherein, if the operating information stored in the storage portion indicates that the equipment is placed in the non-operating state, and the detection portion detects that the equipment is not drawing air, the control portion outputs a warning to a user.

2. The control device according to claim 1, wherein the detection portion measures a flow speed of air drawn or exhausted by the equipment, and wherein the control portion determines that the equipment is drawing or exhausting air by comparing the measured flow speed to a reference value.

3. The control device according to claim 2, wherein the temperature measurement portion and the detection portion are provided at an intake port side of the equipment to measure the temperature and the flow speed of air drawn by the equipment, respectively.

4. The control device according to claim 1, wherein, if the operating information stored in the storage portion indicates that the equipment is placed in the non-operating state, and the detection portion detects that the equipment is not drawing air, the control portion controls the air-conditioning to decrease the temperature of air drawn by the equipment.

5. The control device according to claim 1, wherein the control portion:
   controls the air-conditioning to decrease the temperature of air drawn by the equipment when the measured temperature is higher than a first reference temperature, and the equipment is drawing air; and
   controls the air-conditioning to decrease the temperature of air drawn by the equipment when the measured temperature is higher than a second reference temperature higher than the first reference temperature, regardless of whether the equipment is drawing air.

6. The control device according to claim 3,
   wherein a plurality of pieces of equipment are mounted in a rack, the control device further comprising:
   a movable system including at least one of the temperature measurement portion and the detection portion; and
   a driving system for moving the movable system toward the intake port side of each of the plurality of pieces of equipment.

7. The control device according to claim 6, wherein the control portion controls the driving system to move the movable system based on at least one of a measurement result of the temperature measurement portion or a detection result of the detection portion.

8. A control device for controlling air-conditioning of a room containing equipment, the equipment being capable of drawing outside air to cool down an interior of the equipment, comprising:
   a storage portion for storing operating information indicating that it is abnormal if the equipment is placed in a non-operating state, or that it is not abnormal even when the equipment is placed in the non-operating state;
   a temperature measurement portion for measuring a temperature of air drawn by the equipment;
   a detection portion for measuring a flow speed of air drawn by the equipment;
   a movable system including the temperature measurement portion and the detection portion;
   a driving system for moving the movable system toward an intake port side of the equipment; and
   a control portion for controlling the driving system to measure the temperature or the flow speed of air drawn by the equipment to control the air-conditioning based on a measurement result, the control portion being configured to:
   determine that the equipment is drawing air by comparing the measured flow speed to a reference value;

control the air-conditioning to decrease the temperature of air drawn by the equipment when the measured temperature is higher than a reference temperature, and the equipment is drawing air at a flow speed of at least the reference value;

output a warning to a user when the operating information indicates that it is abnormal if the equipment is placed into a non-operating state, and the equipment is not drawing air at a flow speed of at least the reference value; and maintain a control state of the air-conditioning when the operating information indicates that it is not abnormal if the equipment is placed into a non-operating state and is not drawing air.

9. A control method for controlling air-conditioning of a room containing equipment capable of drawing outside air to cool down an interior of the equipment, comprising:

measuring a temperature of air drawn by the equipment;

detecting whether the equipment is drawing or exhausting air;

controlling the air-conditioning based on the measured temperature and whether the equipment is drawing or exhausting air; and storing operating information indicating that it is abnormal if the equipment is placed in a non-operating state or that it is not abnormal even when the equipment is placed in the non-operating state;

wherein, if the stored operating information indicates that the equipment is placed in the non-operating state, and the detecting detects that the equipment is not drawing air, a warning is output to a user.

10. A computer program stored on a non-transitory computer readable medium, which when executed by a computer, controls air-conditioning of a room containing equipment capable of drawing outside air to cool down an interior of the equipment, comprising program code for:

measuring a temperature of air drawn by the equipment;

detecting whether the equipment is drawing or exhausting air;

controlling the air-conditioning based on the measured temperature and whether the equipment is drawing or exhausting air; and storing operating information indicating that it is abnormal if the equipment is placed in a non-operating state or that it is not abnormal even when the equipment is placed in the non-operating state;

wherein, if the stored operating information indicates that the equipment is placed in the non-operating state, and the detecting detects that the equipment is not drawing air, a warning is output to a user.

11. The method of claim 9, wherein the detecting further comprises measuring a flow speed of air drawn or exhausted by the equipment, and wherein the controlling further comprises determining that the equipment is drawing or exhausting air by comparing the measured flow speed to a reference value.

12. The method of claim 11, wherein the measuring and detecting are performed at an intake port side of the equipment to measure the temperature and the flow speed of air drawn by the equipment, respectively.

13. The method of claim 9, wherein, if the operating information indicates that the equipment is placed in the non-operating state, and the detecting detects that the equipment is not drawing air, the controlling controls the air-conditioning to decrease the temperature of air drawn by the equipment.

14. The method of claim 9, wherein the controlling further comprises:

controlling the air-conditioning to decrease the temperature of air drawn by the equipment when the measured temperature is higher than a first reference temperature, and the equipment is drawing air; and controlling the air-conditioning to decrease the temperature of air drawn by the equipment when the measured temperature is higher than a second reference temperature higher than the first reference temperature, regardless of whether the equipment is drawing air.

15. The computer program of claim 10, wherein the detecting further comprises measuring a flow speed of air drawn or exhausted by the equipment, and wherein the controlling further comprises determining that the equipment is drawing or exhausting air by comparing the measured flow speed to a reference value.

16. The computer program of claim 15, wherein the measuring and detecting are performed at an intake port side of the equipment to measure the temperature and the flow speed of air drawn by the equipment, respectively.

17. The computer program of claim 10, wherein, if the operating information indicates that the equipment is placed in the non-operating state, and the detecting detects that the equipment is not drawing air, the controlling controls the air-conditioning to decrease the temperature of air drawn by the equipment.

18. The computer program of claim 10, wherein the controlling further comprises:

controlling the air-conditioning to decrease the temperature of air drawn by the equipment when the measured temperature is higher than a first reference temperature, and the equipment is drawing air; and controlling the air-conditioning to decrease the temperature of air drawn by the equipment when the measured temperature is higher than a second reference temperature higher than the first reference temperature, regardless of whether the equipment is drawing air.

* * * * *